United States Patent
Musiol et al.

(10) Patent No.: US 6,373,320 B1
(45) Date of Patent: Apr. 16, 2002

(54) CIRCUIT CONFIGURATION FOR OPERATING POINT STABILIZATION OF A TRANSISTOR

(75) Inventors: Lothar Musiol, München (DE); Klaus Jürgen Schöpf, Chandler, AZ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/822,033

(22) Filed: Mar. 29, 2001

Related U.S. Application Data

(63) Continuation of application No. PCT/DE99/02725, filed on Sep. 1, 1999.

(30) Foreign Application Priority Data

Sep. 29, 1998 (DE) .......................................... 198 44 741

(51) Int. Cl.$^7$ ............................................... H03K 17/60
(52) U.S. Cl. ..................... 327/478; 327/538; 327/483
(58) Field of Search ................................ 327/478, 538, 327/540, 542, 530, 378, 482, 483, 484

(56) References Cited

U.S. PATENT DOCUMENTS

| | | | | |
|---|---|---|---|---|
| 3,825,850 A | | 7/1974 | Meri ........................... 330/26 |
| 3,889,137 A | * | 6/1975 | Kay ............................ 327/482 |
| 4,387,346 A | | 6/1983 | Fackler ....................... 330/296 |
| 5,808,507 A | * | 9/1998 | Melse et al. ................. 327/538 |
| 5,926,062 A | * | 7/1999 | Kuroda ........................ 327/538 |
| 6,175,265 B1 | * | 1/2001 | Ueno ........................... 327/538 |

FOREIGN PATENT DOCUMENTS

| | | |
|---|---|---|
| DE | 41 12 697 C1 | 10/1992 |
| DE | 195 05 269 C1 | 5/1996 |
| DE | 197 32 437 C1 | 12/1998 |
| EP | 0 537 792 A1 | 4/1993 |
| FR | 2 365 912 | 4/1978 |

* cited by examiner

*Primary Examiner*—Toan Tran
(74) *Attorney, Agent, or Firm*—Herbert L. Lerner; Laurence A. Greenberg; Werner H. Stemer

(57) ABSTRACT

A circuit configuration is provided for stabilizing an operating point of a first transistor having a base, a collector and an emitter connected to a first power supply. A second transistor has a base, a collector coupled to the base of the first transistor and an emitter coupled to the collector of the first transistor. A first resistor is connected to a second electrical energy supply and is also connected to both the collector of the first transistor and the emitter of the second transistor. A current limiting element is connected to the base of the second transistor and the first power supply. A third transistor has a base, an emitter connected to the second power supply and a collector connected to the base of the second transistor. A second resistor is connected to a reference potential and to the base of the third transistor. A third resistor is connected to the base and the collector of the third transistor.

9 Claims, 1 Drawing Sheet

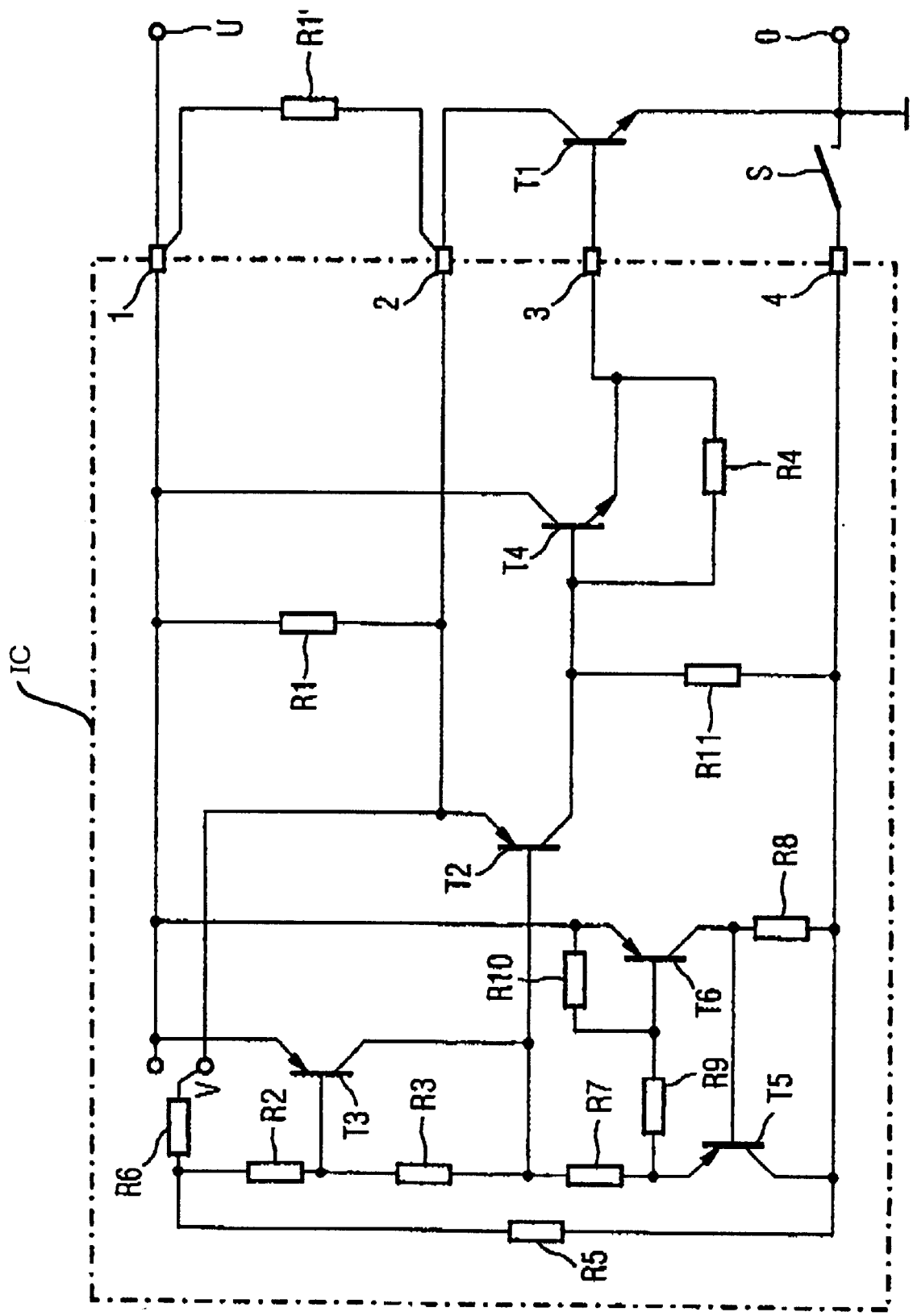

CIRCUIT CONFIGURATION FOR OPERATING POINT STABILIZATION OF A TRANSISTOR

CROSS-REFERENCE TO RELATED APPLICATION

This application is a continuation of copending International Application No. PCT/DE99/02725, filed Sep. 1, 1999, which designated the United States.

BACKGROUND OF THE INVENTION

Field of the Invention

The invention relates to a circuit configuration for stabilizing the operating point of a transistor. Such circuit configurations are known, for example, from a publication entitled: Elemente der angewandten Elektronik [Elements of Applied Electronics], by E. Böhmer, 9th edition, Vieweg-Verlag, Braunschweig, Germany, 1994 and use parallel degenerative feedback or series degenerative feedback.

In parallel degenerative feedback, a resistor is connected in parallel with the collector-base junction of the transistor to be controlled. An increase in the operating current, for example a temperature-induced increase, brings about a drop in the collector-emitter voltage and at the same time a drop in the base current. That produces a degenerative feedback effect.

In series degenerative feedback, a resistor is connected into the emitter lead. The base potential is set through the use of a voltage divider. In the case of a temperature-induced increase in the operating current, the emitter potential is raised, so that the base-emitter voltage, and consequently in turn the base current, is lowered. That in turn produces a degenerative feedback effect.

Apart from temperature fluctuations, fluctuations in the supply voltage and deviations from the nominal value of the current gain of the transistor to be controlled, caused by unavoidable production tolerances, have the effect of causing the operating current to depart from the desired value.

Fluctuations in the supply voltage are unavoidable, particularly in the case of battery-operated electronic devices. In view of the increasing proliferation of mobile electronic devices, such as mobile phones or laptop computers, battery operation is gaining increasingly in significance. Therefore, fluctuations in the supply voltage must be taken into account to a greater extent when constructing electronic circuits. In addition, mobile electronic devices are generally subject to great fluctuations in ambient temperature.

Both in the case of fluctuations in the supply voltage and in the case of deviations of the current gain from the nominal value, the frequently used parallel degenerative feedback only ensures inadequate stabilization of the operating current. In both cases, significant changes in the operating current occur.

Better stabilizing of the operating current in the case of a fluctuating supply voltage or in the case of a deviation of the current gain from the nominal value, can be accomplished with series degenerative feedback. However, it has the major disadvantage of there being a drop in voltage at the resistor connected in the emitter lead, and that voltage has to be additionally supplied by the supply voltage source. However, in view of the development prevailing in the case of electronic devices toward ever lower supply voltages, that is not advantageous.

German Patent DE 195 05 269 C1 discloses a circuit configuration which allows the operating point to be stabilized even in the case of relatively low supply voltages. According to that patent, the operating current is stabilized by connecting, between the collector and the base of the transistor to be controlled, a current-determining mesh including a series connection of at least two diodes, a resistor and the emitter-base junction of a further transistor. For many applications, however, the voltage drop occurring in that circuit configuration is still regarded as too high.

SUMMARY OF THE INVENTION

It is accordingly an object of the invention to provide a circuit configuration for operating point stabilization of a transistor, which overcomes the hereinafore-mentioned disadvantages of the heretofore-known devices of this general type and which ensures an operating current of a transistor even in the case of a low supply voltage.

With the foregoing and other objects in view there is provided, in accordance with the invention, a circuit configuration for stabilizing the operating point of a first transistor with an emitter, a base and a collector, the emitter of which is connected to a first supply potential. Preferably, a second transistor has an emitter, a base and a collector, the collector thereof is coupled to the base of the first transistor and the emitter thereof is coupled to the collector of the first transistor. A first resistor is connected between a second supply potential on one hand and the collector of the first transistor and the emitter of the second transistor on the other hand. A current-limiting element is connected between the base of the second transistor and the first supply potential. A third transistor has an emitter, a base and a collector, the emitter is connected to the second supply potential and the collector is connected to the base of the second transistor. A second resistor is connected between a reference potential and the base of the third transistor. A third resistor is connected between the base and the collector of the third transistor.

It is particularly the third transistor, in connection with the second and third resistors and the reference potential, which has the effect of permitting the voltage to firstly be set and secondly be set in such a way that the voltage drop across the first resistor is as small as possible. If, on the other hand, two diodes were used, one of the diodes would compensate for the voltage drop across the base-emitter junction of the second transistor and the further diode would then fix the voltage drop across the first resistor, namely to the forward voltage of the further diode. In the case of two diodes, the voltage drop across the first resistor would accordingly be approximately 700 mV, while in the case of the device according to the invention the voltage drop across the first resistor can be set, for example, to 100 mV and below. This brings a saving of 0.6 V and more which, for example in the case of customary supply voltages of 2.7 V, still amounts to a saving of over 22%.

In accordance with another feature of the invention, the base of the first transistor is coupled to the collector of the second transistor through a fourth transistor having an emitter, a base and a collector. This is done in such a way that the base of the fourth transistor is connected to the collector of the second transistor, the emitter of the fourth transistor is connected to the base of the first transistor and the collector of the fourth transistor is connected to the second supply potential.

An additional current amplifier formed by the fourth transistor allows the dependence of the stabilized current on the current gain of the first transistor to be considerably reduced. With the low voltage across the first resistor, which is evaluated for setting the operating point, the influence of the current gain of the first resistor is distinctly more disruptive than in the case of a higher voltage drop across the first resistor. Consequently, the application range (maximum collector current), which particularly in the case of bipolar high-frequency transistors is limited by a finite current gain, can also be extended, because a higher base current is possible. In addition, the temperature characteristic of the entire configuration can be advantageously changed greatly, to the extent of being inverted.

In accordance with a further feature of the invention, the temperature characteristic can advantageously be set by a further resistor in such a way that a temperature compensation occurs. For this purpose, a fourth resistor is connected between the base and the emitter of the fourth transistor.

In accordance with an added feature of the invention, the reference potential can be tapped at the tap of a voltage divider having a fifth and a sixth resistor, connected between the first supply potential and a third supply potential.

In accordance with still another feature of the invention, the third supply potential may be equal to the second supply potential or equal to the emitter potential of the second transistor.

In accordance with an additional feature of the invention, in the simplest case, the current-limiting element is formed by a resistor. Consequently, the circuit-related expenditure is kept extremely low. Furthermore, a current source may alternatively be provided. This allows the voltage dependence of the current consumption of the circuit configuration with respect to operating voltage fluctuations to be improved.

In accordance with yet another feature of the invention, the current source includes a fifth transistor with an emitter, a base and a collector, and the collector thereof is connected to the first supply potential. A seventh resistor is connected between the base of the second transistor and the emitter of the fifth transistor. A sixth transistor with an emitter, a base and a collector, has the emitter connected to the second supply potential and the collector connected to the base of the fifth transistor. An eighth resistor is connected between the collector of the sixth transistor and the first supply potential. A ninth resistor is connected between the emitter of the fifth transistor and the base of the sixth transistor. A tenth resistor is connected between the base and the emitter of the sixth transistor.

In accordance with a concomitant feature of the invention, the first and fourth transistors are of a first conduction type and the second, third, fifth and sixth transistors are of a second conduction type.

Other features which are considered as characteristic for the invention are set forth in the appended claims.

Although the invention is illustrated and described herein as embodied in a circuit configuration for operating point stabilization of a transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a schematic circuit diagram of an exemplary embodiment of the invention.

DESCRIPTION OF THE PREFERRED EMBODIMENTS

Referring now in detail to the single figure of the drawing, there is seen an exemplary embodiment in which an operating point of a high-frequency transistor, namely of an npn transistor T1, is to be set. In this case, an emitter of the transistor T1 is connected to a reference potential 0, which is also referred to as a first supply potential. The operating point is stabilized through the use of a drive circuit, which is constructed as an integrated circuit IC. This drive circuit contains a pnp transistor T2, having an emitter which is connected through a terminal or terminal pin 2 of the integrated circuit IC to a collector of the transistor T1. A resistor R1 is connected between the collector of the transistor T1 and a positive supply potential U, which is also referred to as a second supply potential. In addition, a resistor R1' is connected in parallel with the resistor R1 between the emitter of the transistor T2 and the positive supply potential U. In this case, the resistor R1 is realized in the integrated circuit IC, while the resistor R1' is externally connected in parallel with the resistor R1 through terminals 1, 2. The terminal 1 of the integrated circuit IC also serves in this case for feeding the positive supply potential U for the integrated circuit IC. The external resistor R1' allows the operating point setting to be altered subsequently, and customer-specifically, and consequently optimized.

The transistor T2 has a base which is firstly connected through a current source to a terminal 4 of the integrated circuit IC, to which the reference potential 0 is applied. The base of the transistor T2 is secondly connected to a collector of a pnp transistor T3 having an emitter which is connected to the terminal 1 of the integrated circuit and consequently to the positive supply potential U. A resistor R3 is connected between the base and the collector of the transistor T3. The base of the transistor T3 is additionally connected through a resistor R2 to a tap of a voltage divider. The voltage divider includes a resistor R5, which is connected between the tap and the terminal 4 of the integrated circuit IC, and a resistor R6, which is connected between the tap and a supply potential V, which may also be referred to as a third supply potential. In this case, the supply potential v may be provided, for example, by the positive supply potential U or by a potential at the emitter of the transistor T2. In the exemplary embodiment, the emitter potential of the transistor T2 is provided as the supply potential V, and therefore the resistor R6 is connected between the tap and the emitter of the transistor T2.

In the exemplary embodiment, the current source contains a pnp transistor T5 having a collector which is connected to the reference potential 0. Furthermore, a resistor R7 is connected between the base of the transistor T2 and an emitter of the transistor T5. A further pnp transistor T6 is connected in such a way that it has an emitter connected to the supply potential U, a collector connected to the base of the transistor T5 and a base coupled firstly through a resistor R9 to the emitter of the transistor T5 and secondly through a resistor R10 to its own emitter. Finally, a resistor R8 is connected between the reference potential 0 and both the base of the transistor T5 and the collector of the transistor T6.

According to a development of the invention, the driving of the base of the transistor TI does not take place directly through the collector of the transistor T2, but with a driver stage interposed. The driver stage includes an npn transistor T4 having a base connected to the collector of the transistor T2, an emitter connected through a terminal 3 of the integrated circuit IC to the base of the transistor T1 and a collector connected to the terminal 1 of the integrated circuit IC and consequently to the positive supply potential U. Furthermore, the driver stage has a resistor R4 connected between the base and the emitter of the transistor T4 for temperature compensation.

Finally, a resistor R11 may be connected between the collector of the transistor T2 and the terminal 4 of the integrated circuit IC in order to produce a defined load at the collector of the transistor T2. A switch S may also be connected between the terminal 4 of the integrated circuit IC and the reference potential 0.

The operating mode of the circuit configuration according to the invention is based essentially on the concept that a voltage drop across the resistor R1 or R1' is kept as low as possible by the voltage applied between the base and the emitter of the transistor T3 being kept as small as possible and able to be set. A voltage drop (U2) across the resistor R2 which is set in this way corresponds approximately to a voltage (U1) across the resistor R1, since U1+UBE2=U2+UBE3, where UBE2 and UBE3 stand for the base-emitter voltage of the respective transistor T2 and T3. The voltage divider may be connected on one hand to the reference potential 0 as shown and on the other hand in a simple solution to the emitter of the transistor T3 which is not shown. However, it is preferably coupled to the emitter of the transistor T2, which improves the stabilization by this additional degenerative feedback through the use of the resistor R1 or R1'.

Depending on the application, it is possible to use only the resistor R1 or the resistor R1', or both resistors in parallel. In principle, only one of the two resistors is necessary. It is thus possible, for example, for the internal resistor R1 to serve as a dummy for test purposes or in the case of correspondingly low-resistive structures for integrated circuits without an external resistor R1'.

If the voltage divider is additionally supplied at the tap with an operating-voltage-dependent low current, this initiates a lowering of the reference potential at the base of the transistor T3 and consequently of the stabilized current when there is an increase in the operating voltage. Given suitable dimensioning, this effect is used to compensate for the rising current otherwise occurring when there are increases in the operating voltage due to shortcomings of the stabilizing action.

An emitter-follower (transistor T6), fed from the operating voltage, or any other type of driver circuit, can be readily inserted at the open collector of the transistor T2 of the actual control circuit. That is because driver circuits of this type are generally capable of functioning above an operating voltage of approximately 1.6 V (UBE1+UBE4+UCE2s+U1) and, below this voltage, the remainder of the circuit is no longer ready to function. In this case, UBE4 stands for the base-emitter voltage of the transistor T4 and UCE2s stand for the collector-emitter saturation voltage of the transistor T2. The measure mentioned has the effect of strongly suppressing retroactive effects of the controlled high-frequency transistor T1 on the actual control circuit.

An additional effect is that, in the presence of a driver circuit, the operating current rises when the temperature of the overall circuit rises, while without a driver circuit the operating current falls. An additional resistor R6 between the input and output of the driver stage achieves a compromise between these two contrary tendencies, that is a temperature compensation.

A negative current must be fed into the base of the transistor T2, which can take place, for example, through the use of a resistor. This current must be additionally applied by the supply and must not be too small, in particular in the absence of a driver stage, when there is a small operating voltage (approximately 2 V). It is multiplied as the operating voltage increases, since the current is determined by I=(U−U1)/R, where R is the resistance between the base of the transistor T2 and the terminal 4 of the integrated circuit IC. If the resistance is replaced by a current source, defined conditions are created and the voltage-dependence of the current stabilization of the transistor t1 is also reduced from the outset.

We claim:

1. A circuit configuration for transistor operating point stabilization, comprising:

a first transistor with an emitter, a base, a collector and an operating point to be stabilized, said emitter connected to a first supply potential;

a second transistor with an emitter, a base and a collector, said collector coupled to said base of said first transistor and said emitter coupled to said collector of said first transistor;

a first resistor having one terminal connected to a second supply potential and another terminal connected to both said collector of said first transistor and said emitter of said second transistor;

a current-limiting element connected between said base of said second transistor and the first supply potential;

a third transistor with an emitter, a base and a collector, said emitter connected to the second supply potential and said collector connected to said base of said second transistor;

a second resistor connected between a reference potential and said base of said third transistor; and a third resistor connected between said base and said collector of said third transistor.

2. The circuit configuration according to claim 1, including a fourth transistor coupling said base of said first transistor to said collector of said second transistor, said fourth transistor having an emitter, a base and a collector, said base of said fourth transistor connected to said collector of said second transistor, said emitter of said fourth transistor connected to said base of said first transistor and said collector of said fourth transistor connected to the second supply potential.

3. The circuit configuration according to claim 2, including a fourth resistor connected between said base and said emitter of said fourth transistor.

4. The circuit configuration according to claim 3, including a voltage divider connected between the first supply potential and a third supply potential, said voltage divider having a fifth resistor, a sixth resistor and a tap for supplying the reference potential.

5. The circuit configuration according to claim 4, wherein said current-limiting element is a current source.

6. The circuit configuration according to claim 5, wherein said current source includes a fifth transistor with an emitter, a base and a collector, said collector of said fifth transistor connected to the first supply potential; a seventh resistor connected between said base of said second transistor and said emitter of said fifth transistor; a sixth transistor with an emitter, a base and a collector, said emitter of said sixth transistor connected to the second supply potential and said collector of said sixth transistor connected to said base of said fifth transistor; an eighth resistor connected between said collector of said sixth transistor and the first supply potential; a ninth resistor connected between said emitter of said fifth transistor and said base of said sixth transistor; and a tenth resistor connected between said base and said emitter of said sixth transistor.

7. The circuit configuration according to claim 6, wherein said first and fourth transistors are of a first conduction type and said second, third, fifth and sixth transistors are of a second conduction type.

8. The circuit configuration according to claim 4, wherein the third supply potential is equal to the second supply potential.

9. The circuit configuration according to claim 4, wherein the third supply potential is equal to a potential at said emitter of said second transistor.

* * * * *

UNITED STATES PATENT AND TRADEMARK OFFICE
CERTIFICATE OF CORRECTION

PATENT NO. : 6,373,320 B1
DATED : April 16, 2002
INVENTOR(S) : Lothar Musiol et al.

It is certified that error appears in the above-identified patent and that said Letters Patent is hereby corrected as shown below:

<u>Title page,</u>
Item [75], should appear as follows:
-- Lothar Musiol, Tempe (AZ);
Klaus Jürgen Schöpf, Chandler (AZ) both of the (US). --

Signed and Sealed this

Seventeenth Day of September, 2002

*Attest:*

*Attesting Officer*

JAMES E. ROGAN
*Director of the United States Patent and Trademark Office*